Figure 1:
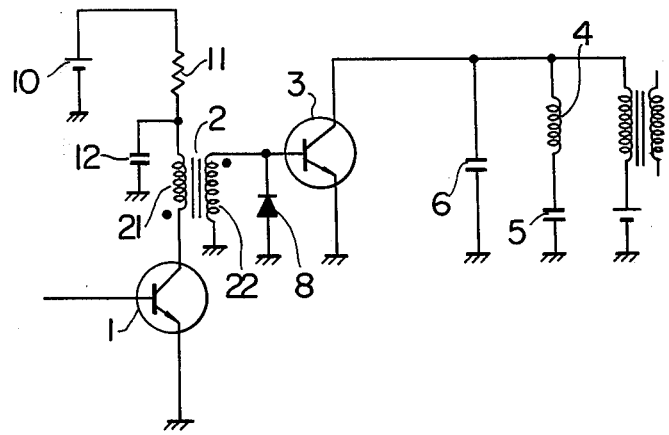

United States Patent [19]

Hashimoto

[11] 4,115,725
[45] Sep. 19, 1978

[54] HORIZONTAL DEFLECTION CIRCUIT

[75] Inventor: Yoitiro Hashimoto, Yokohama, Japan

[73] Assignee: Hitachi, Ltd., Japan

[21] Appl. No.: 754,957

[22] Filed: Dec. 28, 1976

[30] Foreign Application Priority Data

Dec. 30, 1975 [JP] Japan .................................. 50-158258

[51] Int. Cl.² ........................ H01J 29/70; H01J 29/76
[52] U.S. Cl. .................................... 315/403; 315/407; 315/408
[58] Field of Search ............... 315/399, 403, 407, 408, 315/410, 411

[56] References Cited

U.S. PATENT DOCUMENTS 3,396,309  8/1968  Wolfe .................................... 315/403
4,031,453  6/1977  Teuline ................................. 315/411

*Primary Examiner*—S. C. Buczinski
*Attorney, Agent, or Firm*—Craig & Antonelli

[57] ABSTRACT

A horizontal deflection output circuit free of a damper diode includes a horizontal output transistor, between collector and emitter of which a series circuit of a horizontal deflection coil and S-distortion compensation capacitor and a resonance capacitor are connected, and a pulsating switching signal is supplied between the base and emitter of the transistor through an inductive coupling so that the transistor is switched on and off by the pulsating switching signal. An excitation circuit of the horizontal output circuit comprises an excitation transformer having a secondary winding thereof connected to the base-emitter circuit of the output transistor and an excitation transistor connected to a primary winding of the excitation transformer. A diode is connected in parallel with the excitation transistor in a polarity opposite to the conduction polarity of the excitation transistor such that a primary winding impedance of the excitation transformer is reduced at an early stage of a horizontal scan period during which a current flows in a base-collector circuit of the horizontal output transistor.

8 Claims, 2 Drawing Figures

F I G. 2
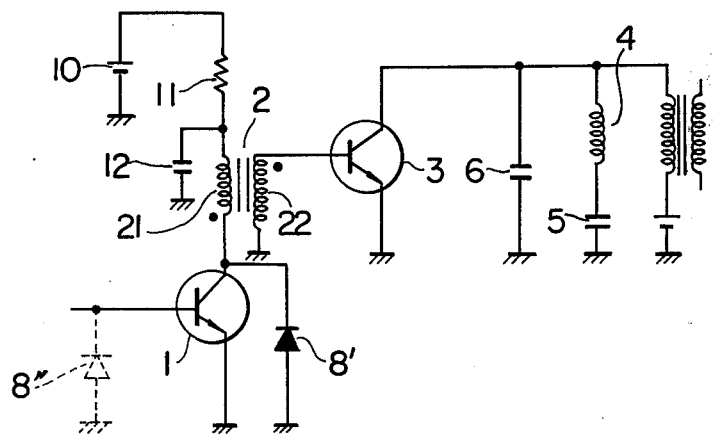

HORIZONTAL DEFLECTION CIRCUIT

The present invention relates to a horizontal deflection circuit free of a damper diode.

FIG. 1 of the accompanying drawing shows a circuit diagram of a prior art horizontal deflection circuit of this type. By turning on a horizontal excitation transistor 1 at a cycle of horizontal period, an off-time of a horizontal output transistor 3 is controlled. An excitation transformer 2 is stored with energy while a collector current of the excitation transistor 1 flows in a primary winding 21 of the excitation transformer 2 and supplies the stored energy to a base-emitter circuit of the horizontal output transistor 3 during the turn-off period of the excitation transistor 1 to turn on the output transistor 3. In the horizontal deflection circuit free of the damper diode, resonance energy stored in a resonance circuit comprising a horizontal deflection coil 4, an S-distortion compensation capacitor 5 and a resonance capacitor 6 during a horizontal retrace period is discharged through a base-collector diode of the output transistor 3 at an early stage of a horizontal scan period. That is, a horizontal deflection current at the early stage of the horizontal scan period flows through the base-collector diode formed by a base-collector junction of the output transistor 3.

A diode 8 is provided to prevent the above current from flowing through a secondary winding 22 of the excitation transformer 2. Without the diode 8, the horizontal deflection current at the early stage of the horizontal scan would flow through the secondary winding 22 of the excitation transformer 2. However, since the excitation transistor 1 is turned off before the horizontal output transistor 3 initiates its normal operation bringing the primary winding 21 of the excitation transformer 2 to an open condition, a high impedance appears when viewed from the base of the output transistor 3 into the excitation transformer 2 and hence the linearity of the horizontal deflection current is deteriorated. Furthermore, if the horizontal deflection current should flow through the secondary winding 22, a negative voltage would appear at the collector of the excitation transistor 1 because the primary winding 21 and the secondary winding 22 are wound in opposite polarity to each other. As a result, an inverse voltage is applied between the collector and the emitter of the excitation transistor 1 causing the deterioration of the characteristic thereof. Accordingly, the diode 8 connected across the secondary winding 22 is effective to eliminate the above difficulty. However, the circuit arrangement of FIG. 1 includes the following disadvantage.

Namely, in order to rapidly switch the output transistor 3 from the turn-on state in which a large base current is flowing to the turn-off state, it is necessary to momentarily apply a high negative voltage to the base of the output transistor 3 to eliminate the influence of a storage effect of the transistor. This momentary negative voltage is derived from a counter e.m.f. generated by suddenly blocking a current flowing in the primary winding 21 of the excitation transformer 2 having the oppositely wound secondary winding 22. However, because of the diode 8 having its cathode connected to the base of the output transistor 3 and the anode connected to the ground, a base voltage of the output transistor 3 does not become more negative than a forward voltage between the anode and the cathode of the diode 8. As a result, it takes a long time for the collector current of the output transistor 3 to fall during the switching from the horizontal scan period to the horizontal retrace period. On the other hand, since a high voltage appears at this time at the collector of the output transistor 3 due to the horizontal retrace pulse, a high power is consumed by the output transistor 3. Because of a general tendency of the increase of a fall time of a collector current of a switching transistor with a temperature of the transistor, the transistor 3 in the circuit of FIG. 1 may thermally overrun into a breakdown.

Moreover, since a resonance energy is discharged through the diode 8, the resonance energy is not supplied to the excitation transformer 2, and the excitation transistor 1 is fed from a D.C. power supply 10 through a resistor 11 and the primary winding 21. Therefore, a large current flows through the resistor 11. This means that a power efficiency of the excitation circuit is low.

An object of the present invention is to provide a horizontal deflection circuit capable of supplying a sufficient backward base current to rapidly reduce a collector current of a horizontal output transistor.

Another object of the present invention is to provide a horizontal deflection circuit having an improved power efficiency.

In order to achieve the above objects, the horizontal deflection circuit according to the present invention includes means for short-circuiting the primary winding of the excitation transformer with a low impedance when an energy stored in a resonance circuit including a horizontal deflection coil is discharged through a base-collector junction diode of the horizontal output transistor, whereby an impedance of a secondary winding of the excitation transformer is reduced.

The above and other objects, features and advantage of the present invention will become more apparent from the following description taken in conjunction with the accompanying drawings, in which:

FIG. 1 is a circuit diagram of a prior art horizontal deflection circuit free of a damper diode, and FIG. 2 is a circuit diagram of an embodiment of a horizontal circuit free of the damper diode according to the present invention.

In FIG. 2 showing an embodiment of the present horizontal deflection circuit free of the damper diode, diode 8' is connected across a collector and an emitter of an excitation transistor 1 in a polarity opposite to conduction polarity of the excitation transistor 1. Accordingly, so long as the excitation transistor 1 or diode 8' is conducting, a primary winding 21 is shortcircuited A.C.-wise. Upon turn-on of the drive transistor 1, an output transistor 3 is turned off initiating a horizontal retrace period. By a resonance circuit comprising horizontal deflection coil 4, an S-distortion compensation capacitor 5 and a resonance capacitor 6, a current flowing through the horizontal deflection coil 4 varies from a magnitude at the end of the horizontal scan back to a magnitude at the start of the horizontal scan. As a energy stored in the horizontal deflection coil 4 by the resonance starts to be discharged through a secondary winding 22 and a base-collector junction diode of the output transistor 3, the horizontal retrace period terminates and a new horizontal scan period starts. Because of the variance in the constants of the resonance circuit comprising the horizontal deflection coil 4, the S-distortion capacitor 5 and the resonance capacitor 6, and storage time of the excitation transistor 1 and the variance in a resonance energy due to variation of a high voltage load, a base current to turn on the excitation transistor 1 is usually supplied after the start of the horizontal scan and until a certain time instant before a forward collector current starts to flow through the output transistor 3. Because of the energy stored in the horizontal deflection coil 4, the forward collector current does not flow even after the turn-off of the excitation transistor 1 so long as the collector voltage of the horizontal output transistor 3 is negative.

A horizontal deflection current at an early stage of the horizontal scan is derived from the energy stored in the horizontal deflection coil 4 being discharged through the secondary winding 22 and the base-collector junction diode of the output transistor 3. When the excitation transistor 1 is conducting, the primary winding 21 is short-circuited by the excitation transistor 1 and a capacitor 12 and hence an impedance seen from the base of the output transistor 3 into the excitation transformer 2 is low. However, after the turn-off of the output transistor 1, without the diode 8', the primary winding 21 would be opened and the impedance seen from the base of the output transistor 3 into the excitation transformer 2 would be high. Accordingly, a desired horizontal deflection current could not be obtained. In the circuit of FIG. 2, even after the turn-off of the output transistor 3, the diode 8' is rendered conductive by a voltage induced in the primary winding when the current flowing through the base-collector junction of the output transistor 3 flows through the secondary winding because the induced voltage is in the polarity to negatively bias the collector of the excitation transistor 1. Accordingly, the impedance seen from the base of the output transistor 3 into the excitation transformer 2 does not increase even after the turn-off of the excitation transistor 1. As a result, an impedance of a path along which the horizontal deflection current flows remains low assuring the horizontal deflection current of good linearity. Furthermore, since the collector voltage of the excitation transistor 1 is clamped by the diode 8' to a potential lower than the ground potential by the forward voltage of the diode 8', a large negative voltage resulting, in the deterioration of the characteristic of the excitation transistor is prevented from being applied to the collector.

Since the capacitor 12 is charged by the voltage induced in the primary winding 21, through the diode 8', the energy stored in the horizontal deflection coil 4 is stored in the capacitor 12 through the excitation transformer 2. In the circuit of FIG. 1, the excitation transistor 1 remains conductive even after the initiation of the horizontal scan because the base current is continuously supplied. In the circuit of FIG. 2, however, since the diode 8' is rendered conductive as soon as the initiation of the horizontal scan to make the collector voltage lower than the emitter voltage, the excitation transistor 1 is turned off upon the initiation of the horizontal scan. Accordingly, the turn-on period of the excitation transistor 1 in FIG. 2 is shorter than that in FIG. 1. As a result, the energy supplied from the D.C. power supply 10 to the primary winding 21 and the excitation transistor 1 is reduced, and hence a power requirement for the resistor 11 connected between the D.C. power supply 10 and the primary winding 1 can be relieved and at the same time a power requirement for the excitation transistor 1 can be relieved.

Instead of connecting the diode 8' between the collector and the emitter of the excitation transistor 1, a diode 8" may be connected between the base and the emitter as shown by a broken line in FIG. 2. In this case, the current for charging the capacitor 12 flows through the diode 8" shown by the broken line and the base-collector junction diode of the excitation transistor 1.

During the period of the collector of the excitation transistor 1 being clamped by the diode 8 to a potential lower than the ground level by the forward voltage of the diode 8', a current may flow from a horizontal oscillation circuit, not shown, connected to the base of the excitation transistor 1, through the base-collector junction diode of the excitation transistor 1 such that the horizontal oscillation circuit may be influenced. In such a case, a diode may be inserted between the junction of the primary winding 21 and the cathode of the diode 8', and the collector of the excitation transistor in the same polarity as the conduction polarity of the excitation transistor 1.

I claim:

1. In a horizontal deflection circuit comprising:
   a horizontal output transistor;
   a horizontal deflection means connected between the collector and emitter of said horizontal output transistor and adapted to conduct a horizontal deflection current therethrough;
   excitation means for generating an excitation signal to control turn-on and turn-off of said horizontal output transistor; and
   an excitation transformer having a primary winding applied with said excitation signal from said excitation means and a secondary winding connected between the base and emitter of said horizontal output transistor, wherein a horizontal deflection current flows at an early stage of the horizontal scan through a series path including the base-collector junction of said horizontal output transistor and said secondary winding, the improvement comprising impedance means connected to said primary winding such that said impedance means exhibits a low impedance to a voltage induced in said primary winding by the horizontal deflection current flowing through said secondary winding at said early stage of the horizontal scan.

2. A horizontal deflection circuit according to claim 1, wherein said impedance means includes a diode connected in a polarity to conduct said voltage induced in said primary winding by said horizontal deflection current flowing through said secondary winding.

3. A horizontal deflection circuit according to claim 2, further comprising a capacitor connected to said primary winding such that it is charged by current flowing through said primary winding from said diode.

4. A horizontal deflection circuit according to claim 1, wherein said excitation means comprises a transistor connected between said primary winding and a reference potential.

5. A horizontal deflection circuit according to claim 4, wherein said impedance means further includes a bypass capacitor coupled across the primary winding of said transformer to said diode to form a series circuit therewith.

6. A horizontal deflection circuit according to claim 4, wherein said impedance means comprises a diode connected to the base of said excitation transistor with a polarity to conduct said voltage induced in said primary winding by said horizontal deflection current flowing through said secondary winding.

7. A horizontal deflection circuit comprising:
   a horizontal output transistor having collector, emitter and base electrodes;

a horizontal deflection coil coupled between said collector and emitter electrodes of said horizontal output transistor;

a transformer having a primary winding and a secondary winding which is connected between said base and emitter electrodes of said horizontal output transistor;

exciting means coupled to said primary winding of said transformer for controlling conductive and non-conductive states of said horizontal output transistor so that a first horizontal deflection current flows through said secondary winding and the PN junction between said base and collector electrodes of said horizontal output transistor during a first portion of a horizontal scanning period, and a second horizontal deflection current flows during a remaining portion of said horizontal scanning period through a conductive path between said collector and emitter electrodes of said horizontal output transistor; and short-circuiting means coupled to said primary winding and operatively exhibiting a low impedance to short-circuit said primary winding when the voltage induced across said primary winding by said first horizontal deflection current flowing through said secondary winding is applied thereto.

8. In a horizontal deflection circuit comprising:

a horizontal output transistor;

a horizontal deflection circuit including a resonance circuit which comprises a horizontal deflection coil and a capacitor and coupled between the emitter and collector of said horizontal output transistor so as to allow a horizontal deflection current to flow therethrough;

an excitation transformer having a primary winding applied with an excitation signal and a secondary winding coupled between the base and emitter of said horizontal output transistor; and excitation means including an excitation transistor with the emitter and collector thereof A.C. coupled across the primary winding of said transformer and further including a control signal source for supplying to an input terminal of said excitation transistor an excitation signal for rendering said excitation transistor conductive or non-conductive to thereby render said horizontal output transistor conductive or non-conductive, wherein both said excitation and horizontal output transistors are rendered non-conductive in an early stage of a horizontal scan operation of the horizontal output transistor;

the improvement comprising impedance means A.C. connected across the primary winding of said transformer, said impedance means including a diode and connected to the primary winding in such a manner that the conductive direction of said diode is opposite to that of said excitation transistor so as to exhibit a low impedance with respect to a voltage induced in said primary winding due to a horizontal deflection current flowing through the secondary winding of said transformer and the PN junction between the base and collector of said horizontal output transistor when both of said transistors are non-conductive.

* * * * *